(12) United States Patent
Chandra et al.

(10) Patent No.: US 10,897,813 B2
(45) Date of Patent: Jan. 19, 2021

(54) DIFFERENTIAL TRACE PAIR SYSTEM

(71) Applicant: Dell Products L.P., Round Rock, TX (US)

(72) Inventors: Umesh Chandra, Santa Cruz, CA (US); Bhyrav M. Mutnury, Round Rock, TX (US); Chun-Lin Liao, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/687,408

(22) Filed: Nov. 18, 2019

(65) Prior Publication Data
US 2020/0092986 A1    Mar. 19, 2020

Related U.S. Application Data

(63) Continuation of application No. 15/825,746, filed on Nov. 29, 2017, now Pat. No. 10,485,096.

(51) Int. Cl.
*H05K 1/00* (2006.01)
*H05K 1/02* (2006.01)
*H05K 1/11* (2006.01)
*H05K 1/16* (2006.01)
*G06F 17/00* (2019.01)
(Continued)

(52) U.S. Cl.
CPC .......... *H05K 1/0245* (2013.01); *H05K 1/025* (2013.01); *H05K 1/0248* (2013.01); *H05K 1/111* (2013.01); *H05K 1/181* (2013.01); *H05K 3/06* (2013.01); *H05K 3/10* (2013.01); *H05K 2201/09218* (2013.01); *H05K 2201/09227* (2013.01); *H05K 2201/09263* (2013.01);
(Continued)

(58) Field of Classification Search
CPC ... H05K 1/00; H05K 1/02; H05K 1/11; H05K 1/16; G06F 17/00; G06F 17/50; H04B 3/32; H04B 3/50; H04L 25/02
USPC ......... 361/767, 762; 716/112, 115, 119, 126, 716/134, 137, 139; 174/250, 260, 261, 174/266; 375/257
See application file for complete search history.

(56) References Cited

U.S. PATENT DOCUMENTS

| 6,845,492 B1 * | 1/2005 | Frank ...................... G06F 30/23 716/112 |
| 6,859,915 B1 * | 2/2005 | Frank ...................... G06F 30/23 716/112 |

(Continued)

*Primary Examiner* — Xiaoliang Chen
(74) *Attorney, Agent, or Firm* — Haynes and Boone, LLP

(57) ABSTRACT

A differential trace pair system includes a board having a first, a second, a third, and a fourth board structure member. A differential trace pair in the board includes a first differential trace extending between the first and the third board structure members, and a second differential trace extending between the second and the fourth board structure members. The differential trace pair includes a serpentine region that includes a first portion and a second portion where the first and the second differential traces have a first width, are substantially parallel, and spaced apart by a first differential trace pair spacing, and a third portion in which the second differential trace includes a second width that is greater than the first width, the first and second differential traces are substantially parallel and spaced apart by a second differential trace pair spacing that is greater than the first differential trace pair spacing.

4 Claims, 13 Drawing Sheets

(51) Int. Cl.
*G06F 17/50* (2006.01)
*H04B 3/32* (2006.01)
*H04B 3/50* (2006.01)
*H04L 25/02* (2006.01)
*H05K 1/18* (2006.01)
*H05K 3/10* (2006.01)
*H05K 3/06* (2006.01)

(52) U.S. Cl.
CPC .............. *H05K 2201/09272* (2013.01); *H05K 2201/09409* (2013.01); *H05K 2201/09727* (2013.01)

(56) References Cited

U.S. PATENT DOCUMENTS

| | | | | |
|---|---|---|---|---|
| 6,889,367 B1* | 5/2005 | Frank | .................... | G06F 30/367 716/112 |
| 6,968,522 B1* | 11/2005 | Frank | .................... | G06F 30/367 716/112 |
| 6,971,077 B1* | 11/2005 | Frank | .................... | G06F 30/23 716/112 |
| 6,976,233 B1* | 12/2005 | Frank | .................... | G06F 30/367 716/112 |
| 6,983,433 B1* | 1/2006 | Frank | .................... | G06F 30/367 716/112 |
| 8,448,196 B2* | 5/2013 | Kitayama | ............. | G11B 17/056 720/652 |
| 8,835,775 B2* | 9/2014 | Fan | ...................... | H05K 1/0245 174/250 |
| 9,118,516 B1* | 8/2015 | Ao | ...................... | H04L 25/0278 |
| 9,479,362 B2* | 10/2016 | Ao | ...................... | H04L 25/0278 |
| 9,750,130 B2* | 8/2017 | Ito | ........................ | H04L 25/0272 |
| 9,996,653 B1* | 6/2018 | Shen | ................. | H01R 13/62994 |
| 2003/0147375 A1* | 8/2003 | Goergen | .............. | H05K 1/0228 370/351 |
| 2003/0179049 A1* | 9/2003 | Goergen | .............. | H05K 1/0248 333/1 |
| 2005/0237776 A1* | 10/2005 | Gropper | ............... | H05K 3/0005 365/1 |
| 2005/0246670 A1* | 11/2005 | Bois | ...................... | G06F 30/367 716/112 |
| 2005/0246671 A1* | 11/2005 | Bois | ...................... | G06F 30/398 716/115 |
| 2005/0246672 A1 | 11/2005 | Bois et al. | | |
| 2005/0249479 A1* | 11/2005 | Frank | .................... | G06F 30/367 385/147 |
| 2005/0251769 A1* | 11/2005 | Frank | .................... | G06F 30/367 716/115 |
| 2005/0251770 A1* | 11/2005 | Frank | .................... | G06F 30/367 716/115 |
| 2008/0178139 A1 | 7/2008 | Pfeil et al. | | |
| 2009/0204934 A1* | 8/2009 | Lin | ...................... | H05K 3/0005 716/130 |
| 2011/0203834 A1* | 8/2011 | Yoneya | ................... | H05K 1/025 174/250 |
| 2013/0090014 A1* | 4/2013 | Champion | ........... | H05K 1/0245 439/626 |
| 2015/0173256 A1* | 6/2015 | Ao | ........................ | G06F 30/394 174/107 |
| 2016/0065391 A1* | 3/2016 | Ao | ..................... | H04L 25/0276 375/257 |
| 2018/0276419 A1 | 9/2018 | Bartley et al. | | |

* cited by examiner

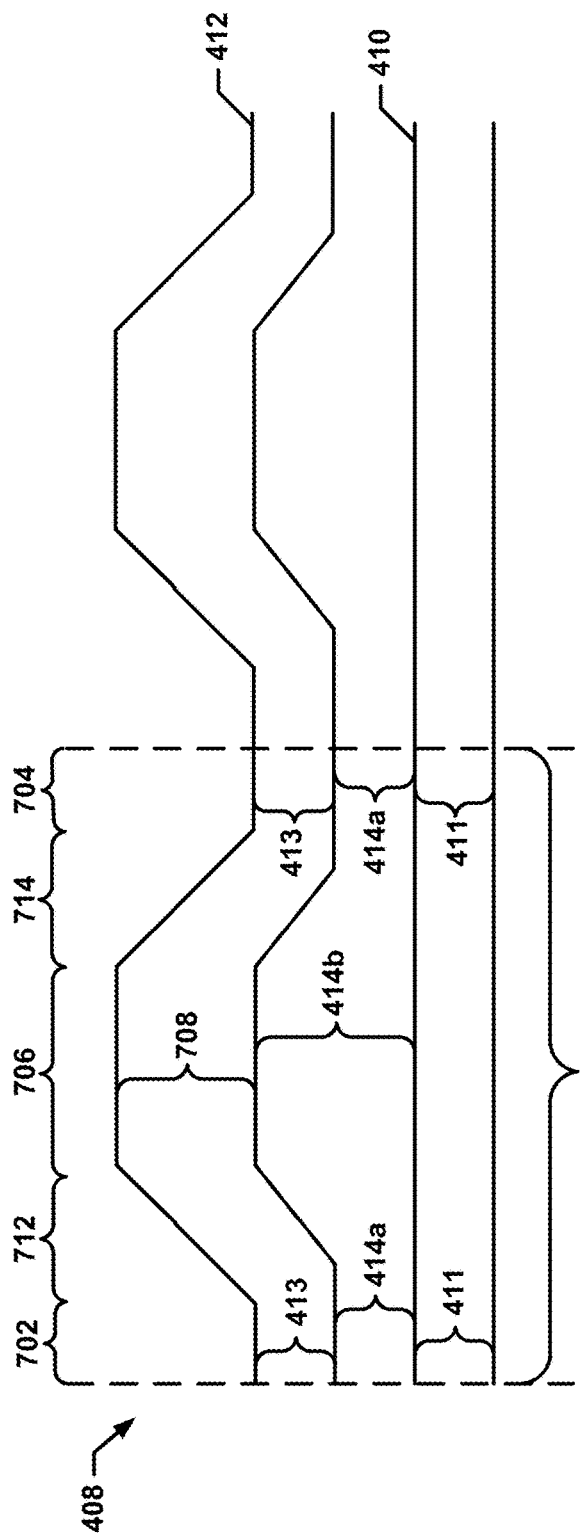
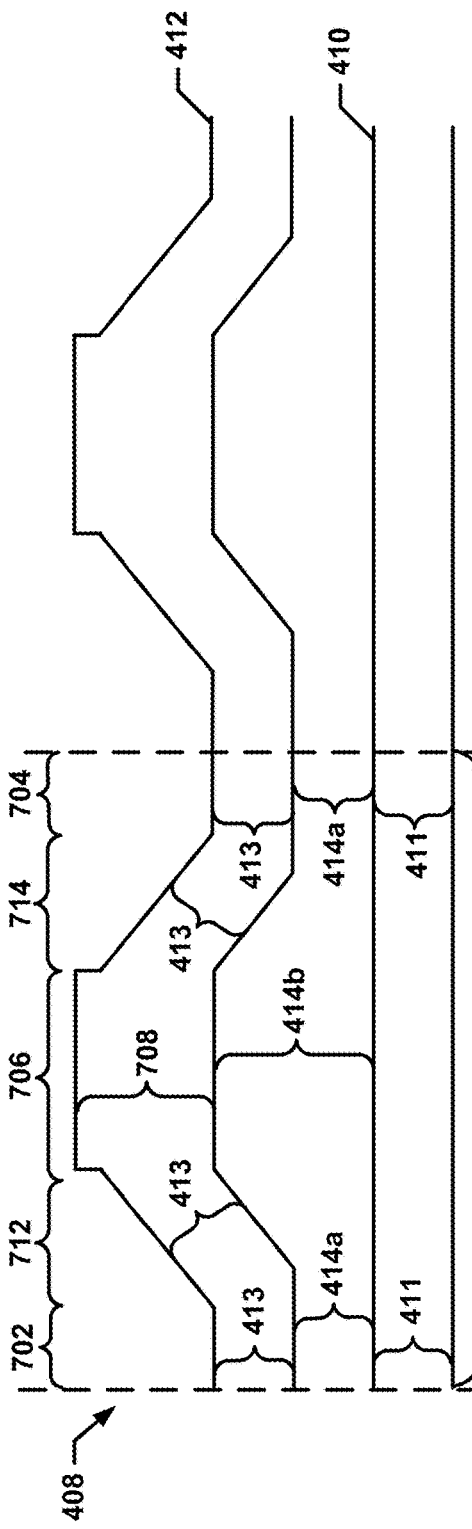

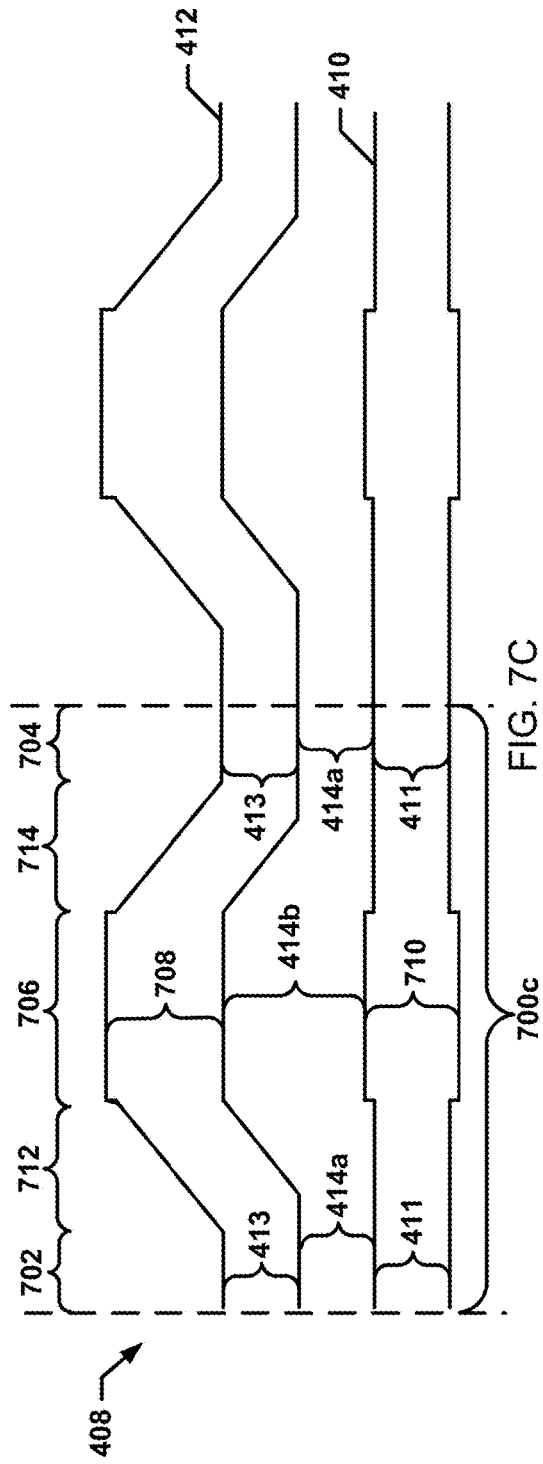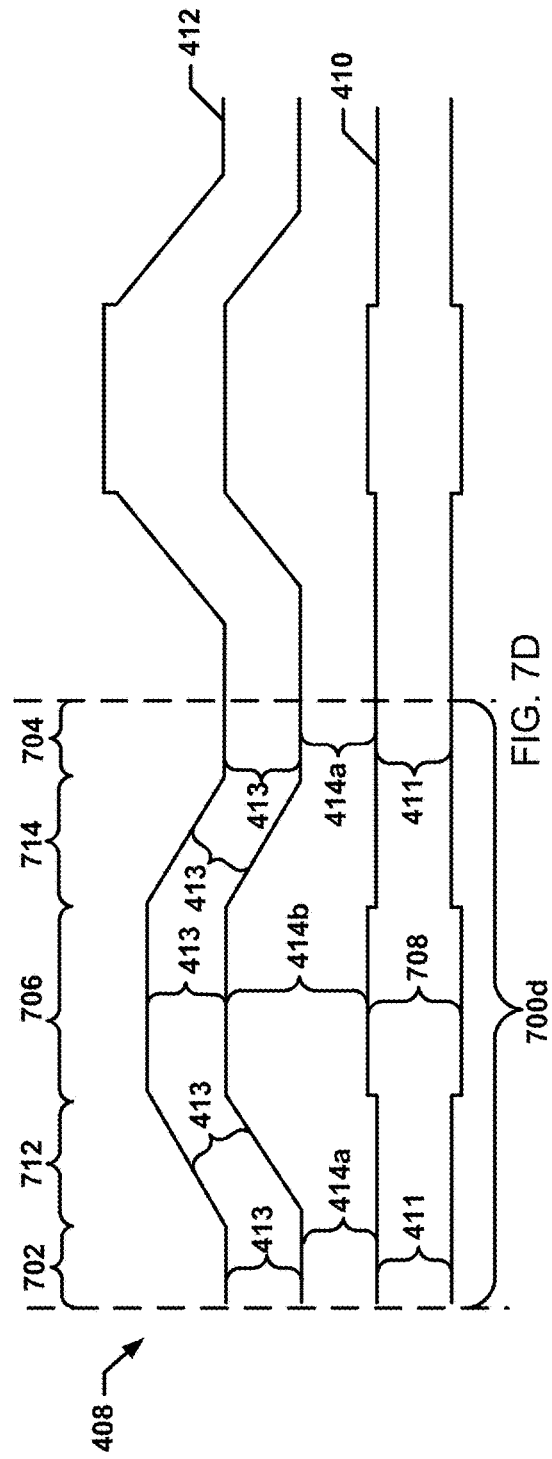

DIFFERENTIAL TRACE PAIR SYSTEM

CROSS-REFERENCE TO RELATED APPLICATIONS

This is a Continuation application to U.S. Utility application Ser. No. 15/825,746 filed Nov. 29, 2017, entitled "DIFFERENTIAL TRACE PAIR SYSTEM," the disclosure of which is incorporated herein by reference in its entirety.

BACKGROUND

The present disclosure relates generally to information handling systems, and more particularly to a differential trace pair system in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switches, servers, and/or other computing devices typically include circuit boards with communication traces that are connected to different subsystems in order to provide for the transmission of information between those subsystems. For example, a differential trace pair may be provided between a transmitter subsystem and a receiver subsystem in the switch or server (or between different switches and/or servers) in order allow those subsystems to transmit and receive information. In some situations, the differential trace pair may couple to the transmitter subsystem and/or the receiver subsystem at connectors such as, for example, a pin included in a pin field (e.g., a Ball Grid Array (BGA) pin field.) The routing of differential trace pairs through such connectors can cause issues with the differential trace pair due to the connector arrangement, the placement of the differential trace pair, the angle of routing, and/or other differential trace pair routing characteristics known in the art. One of the common issues encountered in routing differential trace pairs in these and similar situations is when that routing results in one of the traces in the differential trace pair being longer than the other. This mismatch of trace length may cause common mode noise where a signal sent from the transmitter subsystem on the shorter trace in the differential trace pair arrives at the receiver subsystem before the signal that was sent from the transmitter subsystem on the longer trace in the differential trace pair. This problem is amplified as signal speeds increase beyond 25 Gbps, as the resulting common mode noise cannot be ignored, and issues associated with increased insertion and return loss are introduced.

Conventional systems attempt to remedy this issue by flipping the polarity at the receiver subsystem end of the differential trace pair such that the shorter trace leaving the transmitter subsystem end of the differential trace pair becomes the longer trace entering the receiver subsystem end of the differential trace pair. However, such solutions result in common mode noise throughout the routing of the differential trace pair, and are not possible on all system designs. Another conventional method for compensating for such differing trace length is to provide a serpentine trace region in the shorter trace that increases the length of the shorter trace to match that of the longer trace. The serpentine region length matching of the traces in the differential trace pair solves the common mode noise issue discussed above, but as signal speeds are increased to over 25 Gbps (e.g., 32 Gbps to 50/56 Gbps and beyond), the serpentine region length matching approach produces signal integrity issues. For example, when the shorter trace moves away from the longer trace in the serpentine region of the differential trace pair, an increase in impedance can occur (e.g., increases in impedance of 7-15 ohms have been observed depending on the stack-up cross-section and the material of the circuit board), resulting in high signal speed reflections and losses.

Accordingly, it would be desirable to provide an improved serpentine region in a differential trace pair.

SUMMARY

According to one embodiment, an information handling system (IHS) includes a processor; a circuit board having a connection pad array that couples the processor to the circuit board, wherein the connection pad array includes a first connection pad, a second connection pad, a third connection pad, and a fourth connection pad; a differential trace pair that is provided in the circuit board and that includes: a first differential trace included on the board and extending between the first connection pad and the third connection pad; a second differential trace included on the board and extending between the second connection pad and the fourth connection pad; and a serpentine region of the differential trace pair that includes: a first portion and a second portion in which the first differential trace and the second differential trace each have a first width, the first differential trace and the second differential trace are substantially parallel, and the first differential trace and the second differential trace spaced apart by a first differential trace pair spacing; a third portion that is located between the first portion and the second portion and in which the second differential trace includes a second width that is greater than the first width, the first differential trace and the second differential trace are substantially parallel, and the first differential trace and the second differential trace are spaced apart by a second differential trace pair spacing that is greater than the first differential trace pair spacing.

BRIEF DESCRIPTION OF THE DRAWINGS

FIG. 7A is a schematic view illustrating an embodiment of a serpentine region of the differential trace pair of FIG. 4.

FIG. 7B is a schematic view illustrating an embodiment of a serpentine region of the differential trace pair of FIG. 4.

FIG. 7C is a schematic view illustrating an embodiment of a serpentine region of the differential trace pair of FIG. 4.

FIG. 7D is a schematic view illustrating an embodiment of a serpentine region of the differential trace pair of FIG. 4.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
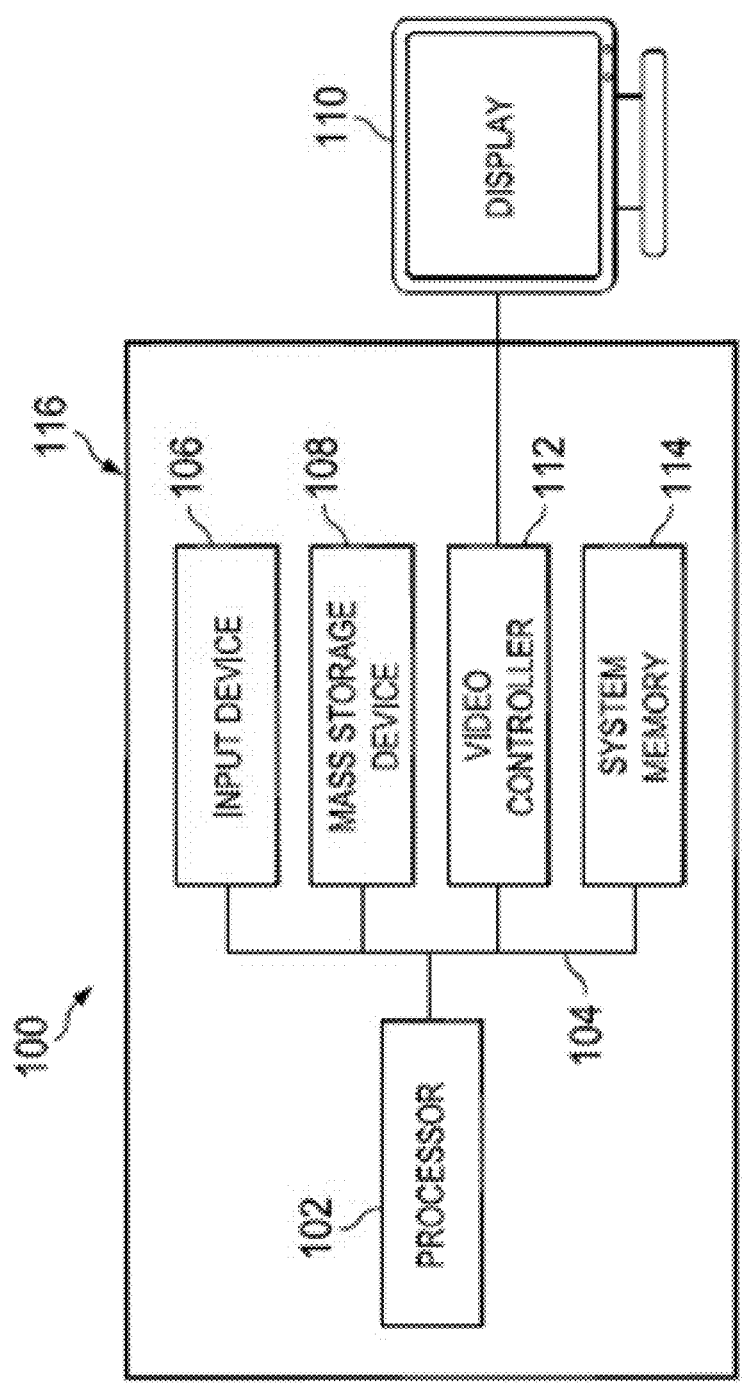
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
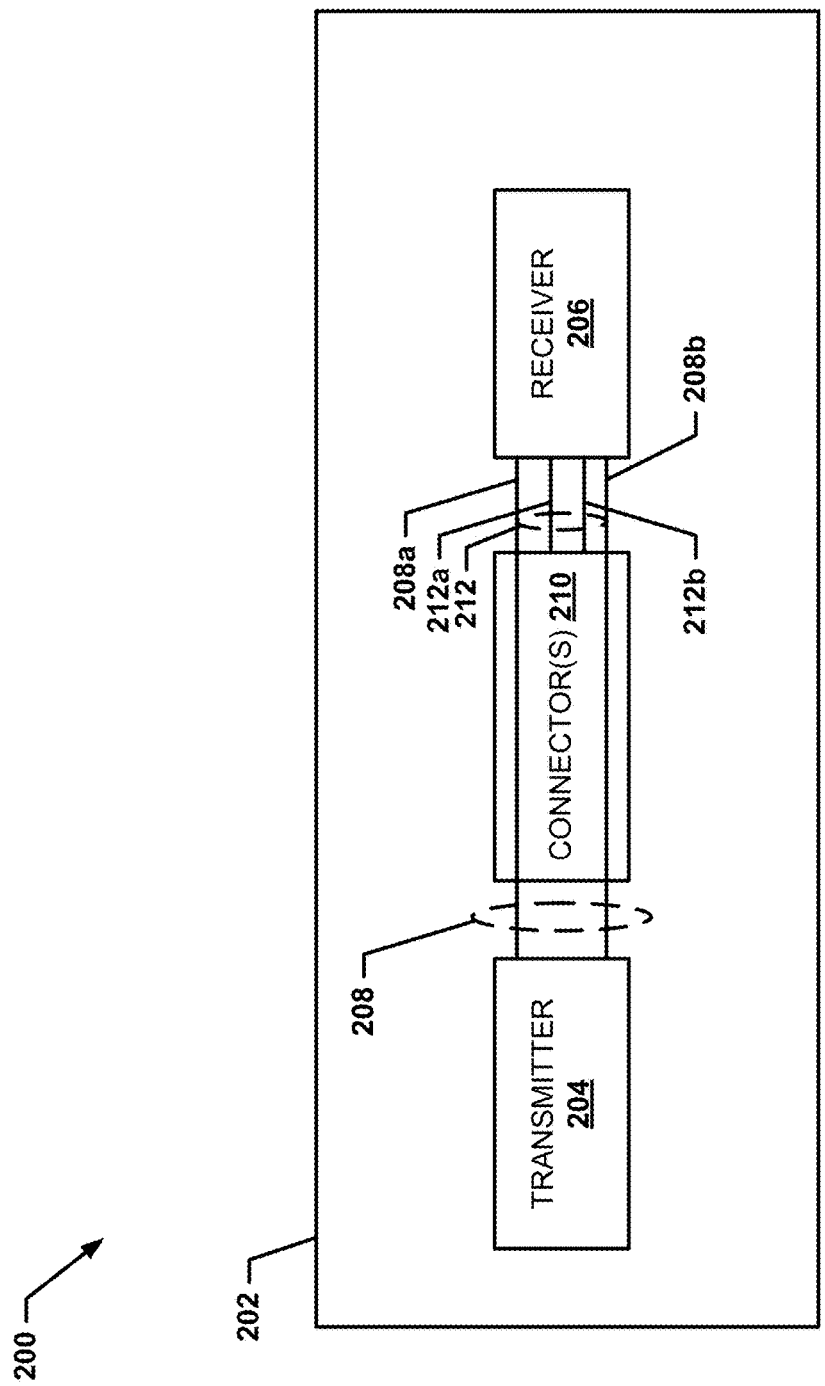
FIG. 2 is a schematic view illustrating a differential trace pair system.

Referring now to FIG. 2, an embodiment of a differential trace pair system 200 is illustrated. In an embodiment, the differential trace pair system 200 may be provided in the IHS 100 discussed above with reference to FIG. 1, and/or in one or more components of the IHS 100. In the illustrated embodiment, the differential trace pair system 200 includes a board 202 such as, for example, a circuit board that is provided to interconnect one or more components in the differential trace pair system 200. For example, a transmitter 204 and a receiver 206 may be mounted to the board 202 using a variety of couplings or connecters (e.g., surface mount technology (SMT) connectors and/or other connectors known in the art). In an embodiment, the transmitter 204 and/or the receiver 206 may be processing systems such as the processor 102 discussed above with reference to FIG. 1, communication systems, and/or other subsystems that communicate via differential trace pairs as is known in the art. A differential trace pair 208 that includes a first differential trace 208a and a second differential trace 208b is provided in the board 202 and extends through the board 202 between the transmitter 204 and the receiver 206. In an example, a differential trace pair 212 that includes a first differential trace 212a and a second differential trace 212b is provided in the board 202 and extends from the connectors 210 (e.g., surface mount technology (SMT) connectors and/or other connectors known in the art) to the receiver 206. In other examples, differential trace pairs may be routed to electrically couple connectors, to electrically couple couplings within transmitters, to electrically couple transmitters to connectors, to electrically couple couplings within receivers, and/or to couple any of a variety of other computing subsystems that would be apparent to one of skill in the art in possession of the present disclosure. One of skill in the art in possession of the present disclosure will recognize that the differential trace pair system 200 has been greatly simplified for clarity of discussion, and a board may include many more transmitters, receivers, and couplings/connectors than have been illustrated, with many more differential trace pairs than have been illustrated, while remaining within the scope of the present disclosure. Furthermore, a wide variety of other board and system features that have been omitted for clarity may be provided in the differential trace pair system 200 while remaining within the scope of the present disclosure.

Figure 3A:
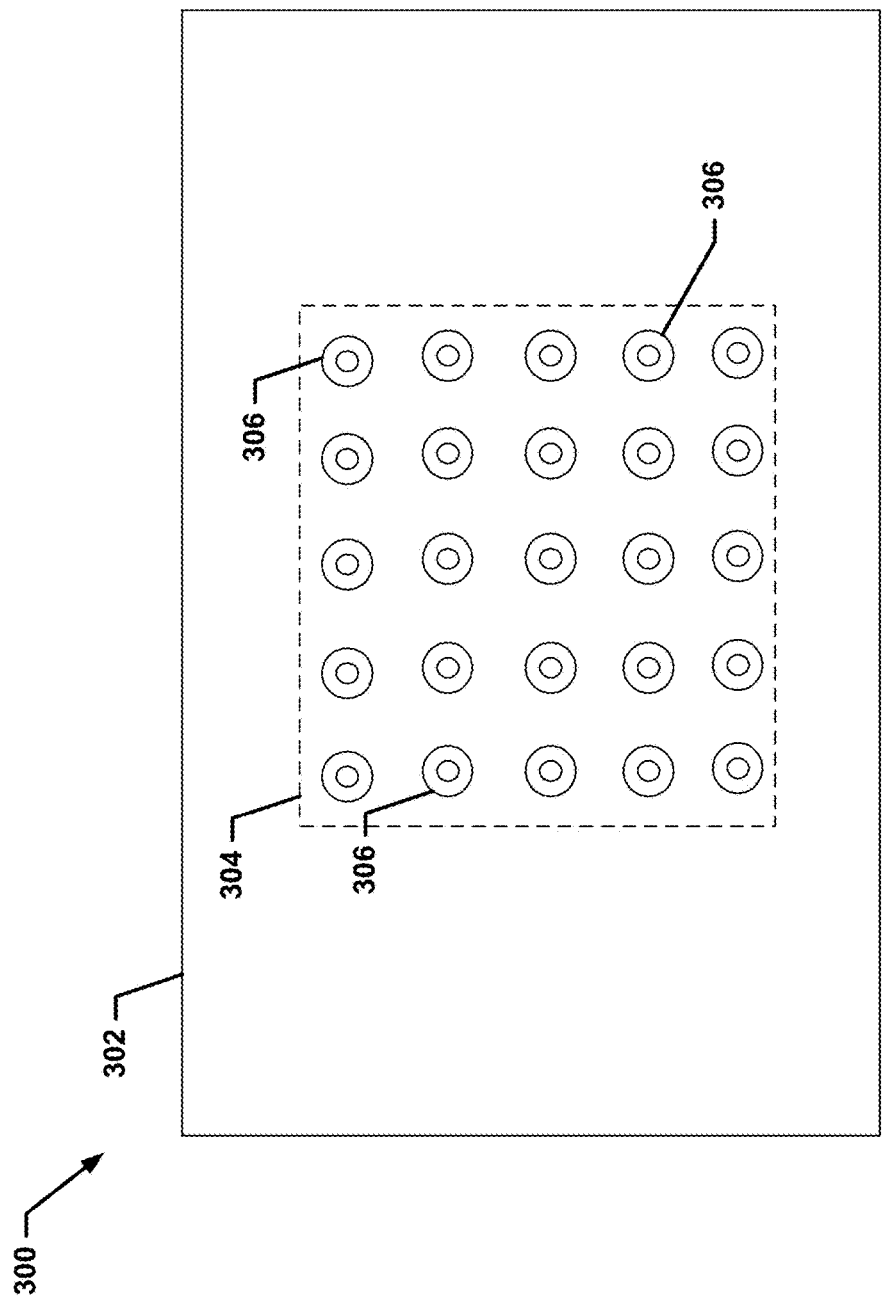
FIG. 3A is a schematic view illustrating an embodiment of a board structure in the differential trace pair system of FIG. 2.
Figure 3B:
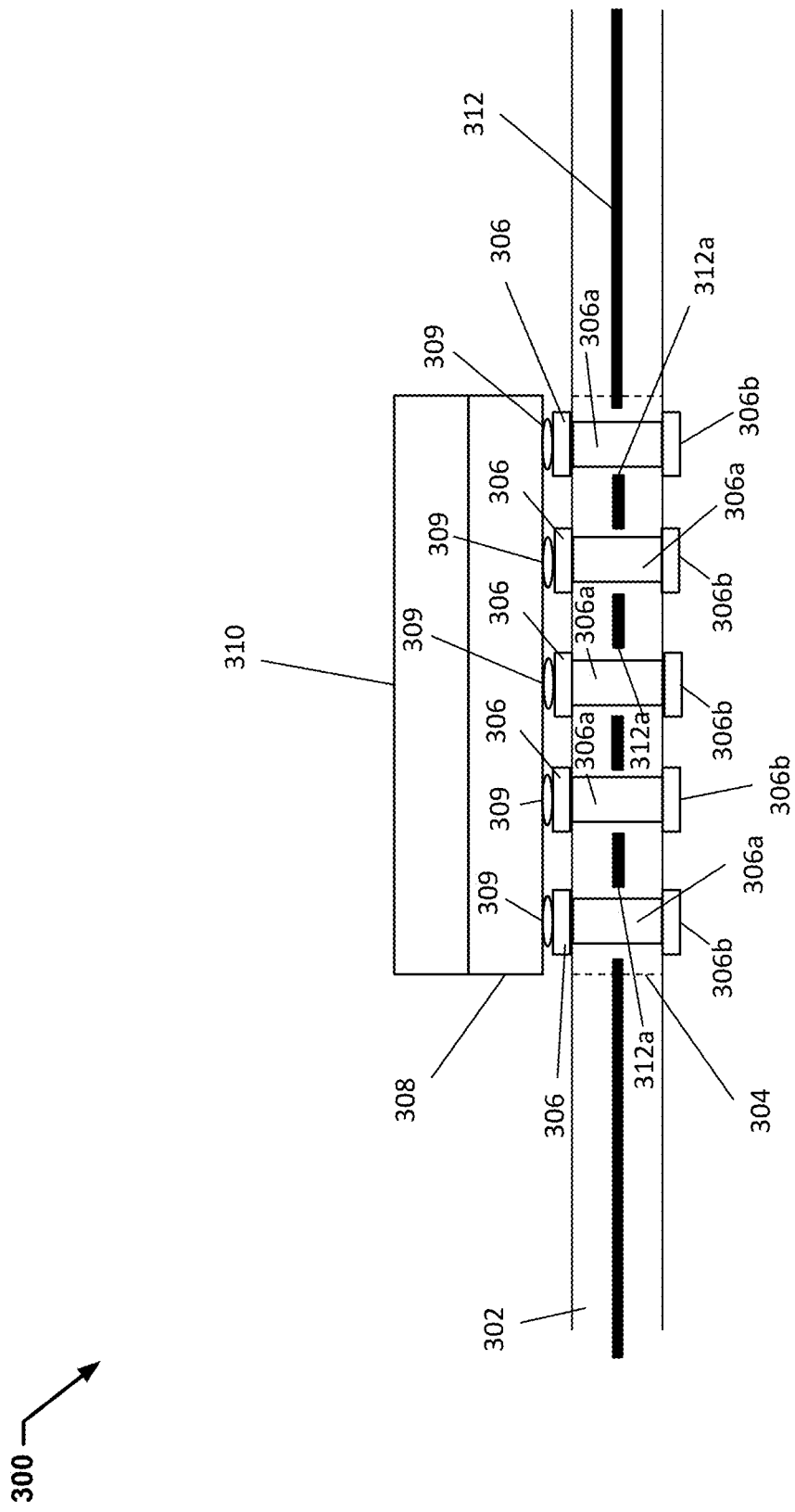
FIG. 3B is a schematic view illustrating an embodiment of the board structure of FIG. 3a coupled to a connector and a processing system.

Referring now to FIGS. 3A and 3B, an embodiment of a board structure 300 is illustrated. In the embodiments discussed below, the board structure 300 is described as a connection pad array that may be used, for example, to couple or connect the transmitter 204, the receiver 206, and/or the connector(s) 210 to the board 202 in FIG. 2. However, in other embodiments, the board structure 300 may be other board structures such as, for example, system chassis structural members, non-conductive features or layers in the board, and/or a variety of other board structures known in the art. The board structure 300 includes a board 302, which may be the board 202 discussed above with reference to FIG. 2. A board structure area 304 is included on the board 302, and a plurality of board structure members 306 are provided in the board structure area 304. In the illustrated embodiment, the board structure 300 is a connection pad array and includes the board structure members 306 as connection pads that are provided in the board 302 in a symmetrical, spaced-apart array. However, in other embodiments, any orientation and/or positioning of board structure members is envisioned as falling within the scope of the present disclosure.

FIG. 3B illustrates a specific example of the board structure 300 as a connection pad array. As can be seen, each of the board structure members 306 (e.g., top connection pads in this embodiment) is coupled to a respective via 306a that is provided in the board 302 and that may be coupled and/or connected to one or more traces and/or other board features as is known in the art, as well as to a respective board structure members 306b (e.g., bottom connection pads in this embodiment). A connector 308 such as, for example, an SMT connector (e.g., a Ball Grid Array (BGA) connector in this embodiment) is mounted to the board structure members 306 using solder balls 309 and/or other methods known in the art. A system component 310 (e.g., a processing system in this embodiment) is mounted to the connector 308 and coupled through the connector 308 to the connection pads 306, vias 306a, connection pads 306b, and/or other features in the board 302. As such, the system component 310 (e.g., a processing system) may be the transmitter 204 and/or receiver 206 of FIG. 2 and thus may transmit and/or receive data through the differential trace pair 208 as described in further detail below. However, in other embodiments, the board structure 300 may not couple to a connector and a system component (i.e., the board structure 300 may be non-communication structure that simply provides a trace-routing obstruction in the board 302) while remaining within the scope of the present disclosure. In the illustrated embodiment, an internal plane 312 is included in the board 302 and defines a plurality of anti-pads 312a adjacent each of the vias 306a.

Figure 4:
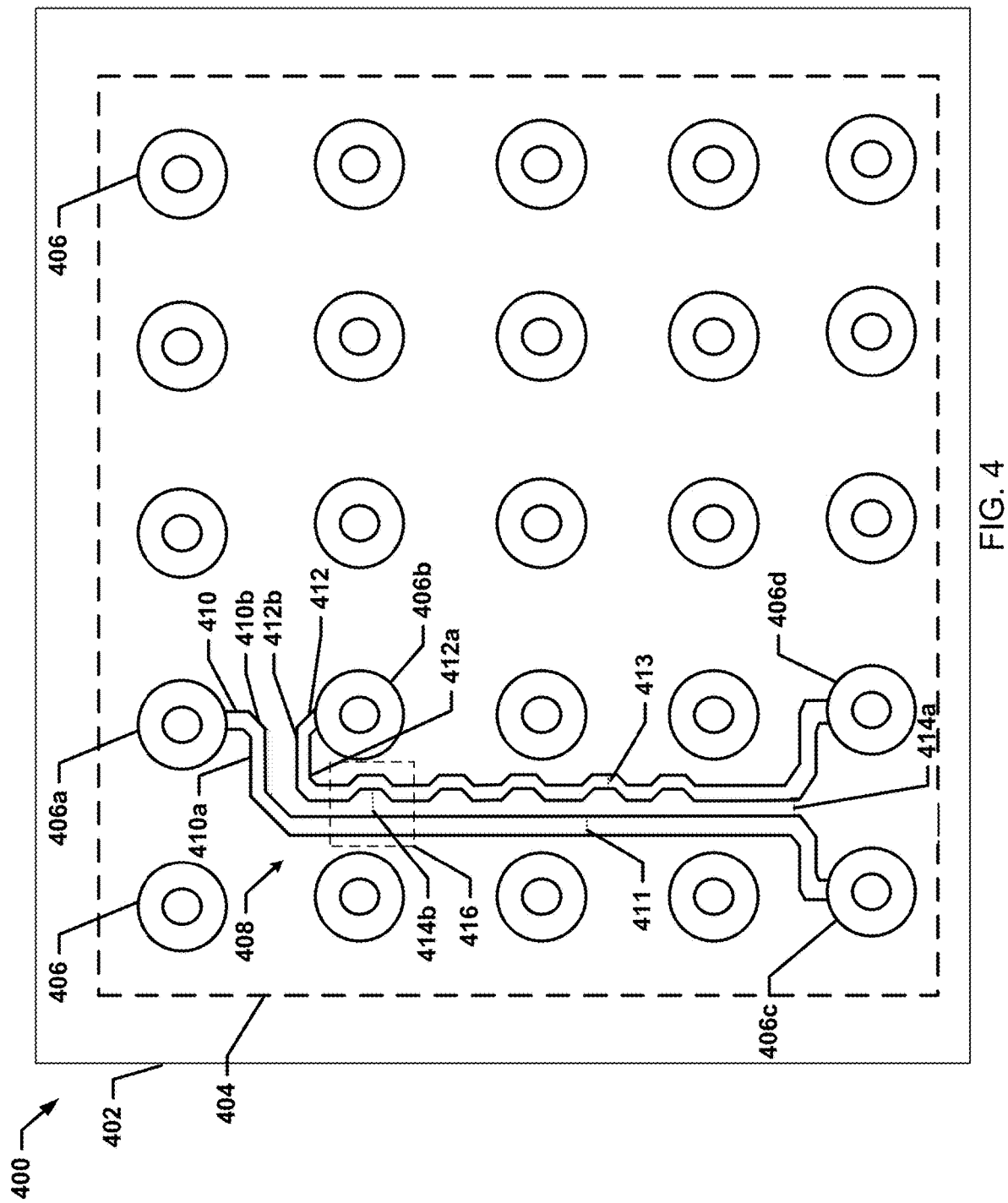
FIG. 4 is a schematic view illustrating an embodiment of a differential trace pair with a serpentine region that is routed through the board structure of FIGS. 3a and 3b.

Referring now to FIG. 4 and, an embodiment of a differential trace pair route 400 is illustrated. In the embodiment of FIG. 4, the differential trace pair route 400 includes a board 402, which may be the board 202 discussed above with reference to FIG. 2 or the board 302 discussed above with reference to FIGS. 3A and 3B. The board 402 also includes a board structure 404 that may be the board structure 300 discussed above with reference to FIGS. 3A and 3B. The board structure 404 may include a plurality of board structure members 406, and in particular includes a first board structure member 406a, a second board structure member 406b, a third board structure member 406c, and a fourth board structure member 406d that are coupled together by a differential trace pair 408 provided in the board 402 in the examples discussed below. For example, the first board structure member 406a and the second board structure member 406b may be couplings/connectors for the transmitter 204, while the third board structure member 406c and the fourth board structure member 406d may be couplings/connectors for the receiver 206. The differential trace pair 408 includes a first differential trace 410 and extends between (e.g., electrically couples) the first board structure member 406a and the third board structure member 406c, and the differential trace pair 408 also includes a second differential trace 412 that extends between the second board structure member 406b and the fourth board structure member 406d. The first differential trace 410 provides a first outer edge 410a of the differential trace pair 408 and includes a first inner edge 410b that is located opposite the first differential trace 410 from the first outer edge 410a. The first outer edge 410a and the first inner edge 410b define a first trace width 411. The second differential trace 412 provides a second outer edge 412a of the differential trace pair 408 and includes a second inner edge 412b that is located opposite the second differential trace 412 from the second outer edge 412a. The second outer edge 412a and the second inner edge 412b define a second differential trace width 413. The first differential trace 410 and the second differential trace 412 in the differential trace pair 408 define differential trace pair spacings between the first inner edge 410b and the second inner edge 412b such as, for example, the first differential trace pair spacing 414a illustrated in FIG. 4 that is the closest spacing between the first inner edge 410b and the second inner edge 412b in the examples discussed below.

As illustrated in FIG. 4, the distance between the first board structure member 406a and the third board structure member 406c is greater than the distance between the second board structure member 406b and the fourth board structure member 406d. Thus, if the differential trace pair 408 were to substantially maintain the first differential trace pair spacing 414a between the first inner edge 410b of the first differential trace 410 and the second inner edge 412b of the second differential trace 412, the first differential trace 410 would be longer than the second differential trace 412, resulting in the common mode noise discussed above. As such, as discussed above, conventional differential trace pairs may include serpentine region(s) 416 to address such trace length mismatches. As can be seen in FIG. 4, the serpentine region 416 may provide sections of the "shorter" second differential trace 412 (i.e., the differential trace in the differential trace pair that would be shorter than the other differential trace without the serpentine region(s)) that transition away from the "longer" first differential trace 410 (i.e., the differential trace in the differential trace pair that would be longer than the other differential trace without the serpentine region(s)) such that the first differential trace 410 the second differential trace 412 define a second differential trace pair spacing 414b illustrated in FIG. 4 that is the furthest spacing between the first inner edge 410b and the second inner edge 412b in the examples discussed below. The serpentine region(s) 416 may maintain the second differential trace pair spacing 414b for some distance before the second differential trace 412 transitions back toward the first differential trace 410, as illustrated. Each transition between the first differential trace pair spacing 414a and differential trace pair spacing 414b adds length to the "shorter" second differential trace 412, and the differential trace pair 408 may include a plurality of the serpentine regions 416 such that the second differential trace 412 is provided with substantially the same length as the first differential trace 410. While a specific differential trace pair has been illustrated and described, one of skill in the art in possession of the present disclosure will recognize that differential trace pairs may include a variety of different features (e.g., turns, different transitions, etc.) while remaining within the scope of the present disclosure.

One of skill in the art in possession of the present disclosure will recognize that the differential trace pair 408 will produce an impedance that may depend, at least in part, on the width of the differential traces (e.g., the first differential trace 410 and the second differential trace 412) in the differential trace pair 408, the spacing (e.g., the differential trace pair spacing) between the differential traces, the data transmission speed of signals transmitted through the differential trace pair 408, as well as a variety of other factors (e.g., the dielectric constant of the differential traces, the loss dielectric materials of the differential traces, etc.). For example, the first trace width 411, the second trace width 413, and the first differential trace pair spacing 414a of a first differential trace pair region of the differential trace pair 408 may provide a first impedance at a particular data transmission speed (e.g., 25 Gbs, 32 Gbps, 50/56 Gbps); while the first trace width 411, the second trace width 413, and the second differential trace pair spacing 414b provided in the serpentine region 416 of the differential trace pair 408 may provide a second impedance at that particular data transmission speed that is greater than the first impedance. In conventional systems where the first trace width 411 and the second trace width 413 are the same at the first differential trace pair spacing 414a and the second differential trace pair spacing 414b, the change in first differential trace pair spacing 414a and the second differential trace pair spacing 414b results in impedance mismatching. For example, in an experimental embodiment of a conventional differential trace pair discussed below with reference to FIG. 5, the differential trace pair 408 provided with the first differential trace pair spacing 414a produced a first impedance of 85 ohms, while the differential trace pair 408 provided with the second differential trace pair spacing 414b produced a second impedance of 100 ohms. As discussed above, this impedance mismatch at signal speeds above 25 Gbps will result in reflections, return losses, insertion losses, and/or a variety of other issues that result in degradation of the Bit Error Rate (BER) and Eye Diagram, and that reduce the margin for detecting errors in data transmission and reception.

Figure 5:
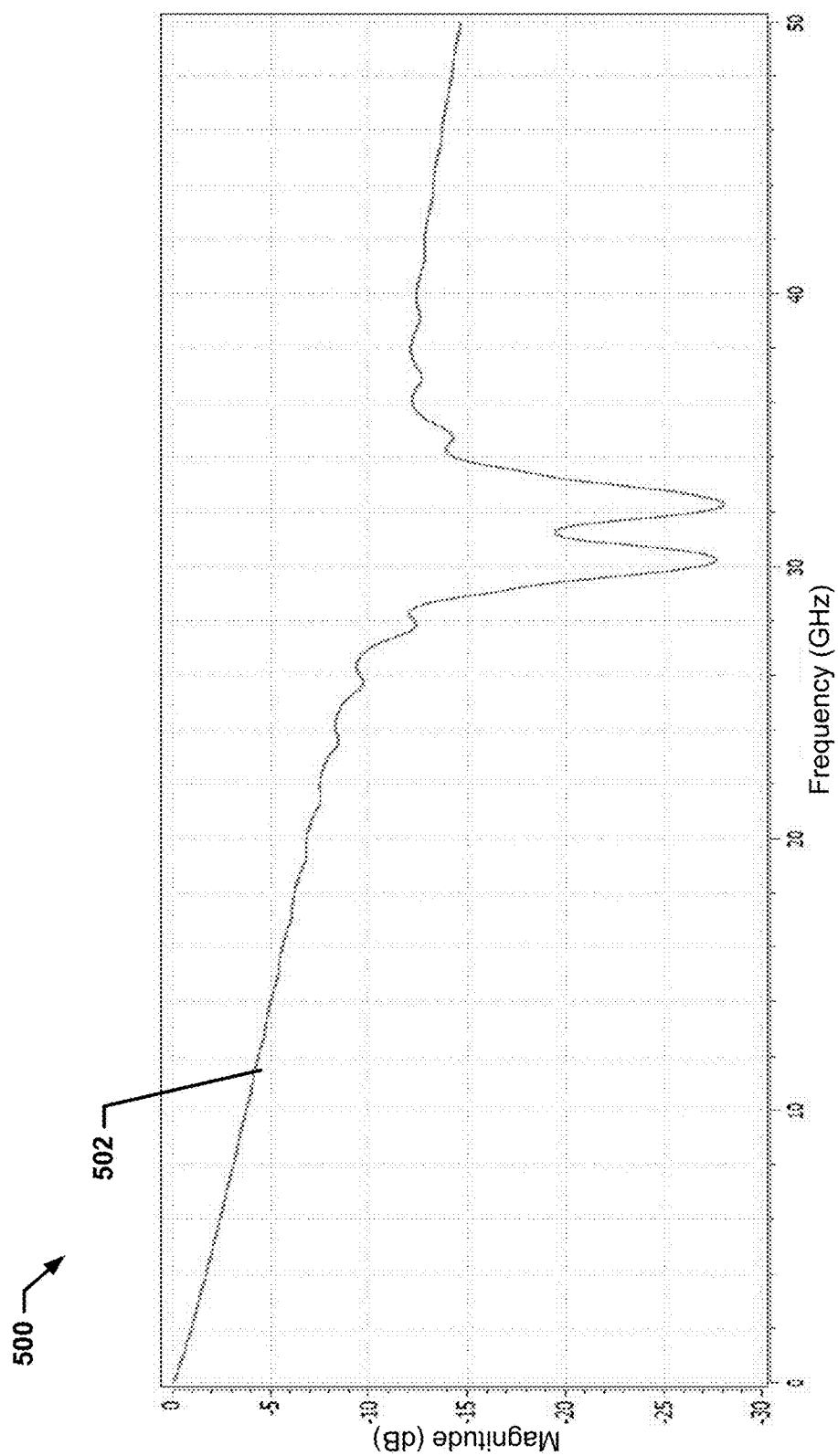
FIG. 5 is a graph illustrating an embodiment of insertion losses that may be introduced due to conventional serpentine region.

Referring now to FIG. 5, a graph 500 is illustrated that plots insertion loss between a transmitter and a receiver using a conventional differential trace pair that utilizes conventional serpentine trace routing for length/phase matching. Specifically, in an experimental embodiment, a differential trace pair was provided with 2 inches of trace, a first differential trace spacing of 6 mils, a second differential trace spacing of 20 mils, trace widths of 5 mils, and a signal speed of 56 Gbps. The conventional differential trace pair experimental embodiment 502 included the same trace width for each of the traces in the serpentine region 416 of the differential trace pair (as illustrated in FIG. 4), and the insertion losses resulting from signal transmission through that differential trace pair is plotted on the graph 500 of loss vs. frequency. As can be seen, a resonance in insertion loss occurred at the frequency range of 28-36 GHz and, as would be understood by one of skill in the art in possession of the present disclosure, this resonance can be detrimental to the signals transmitted using the differential trace pair, and can result in poor signal integrity if the transmitter is operating in the proximity of the resonance.

As discussed below, the methods and systems of the present disclosure provide a differential trace pair that includes serpentine region(s) that provide a first impedance when the differential trace pair is at the first differential trace pair spacing, and a second impedance when the differential trace pair is at the increased second differential trace pair spacing, and that second impedance is the same as, matches, or is otherwise substantially similar to (e.g., within 5%) the first impedance in order to eliminate, reduce, or otherwise minimize impedance discontinuities that can result in losses such as, for example, return losses, insertion loss, and/or other losses that would be apparent to one of skill in the art in possession of the present disclosure. However, if the width of one trace is increased too much, the trace would become much too close to adjacent circuits, power planes, so the trace would have higher crosstalk risk. The total width of the differential trace pair would become larger and consume real estate on the printed circuit board.

Figure 6:
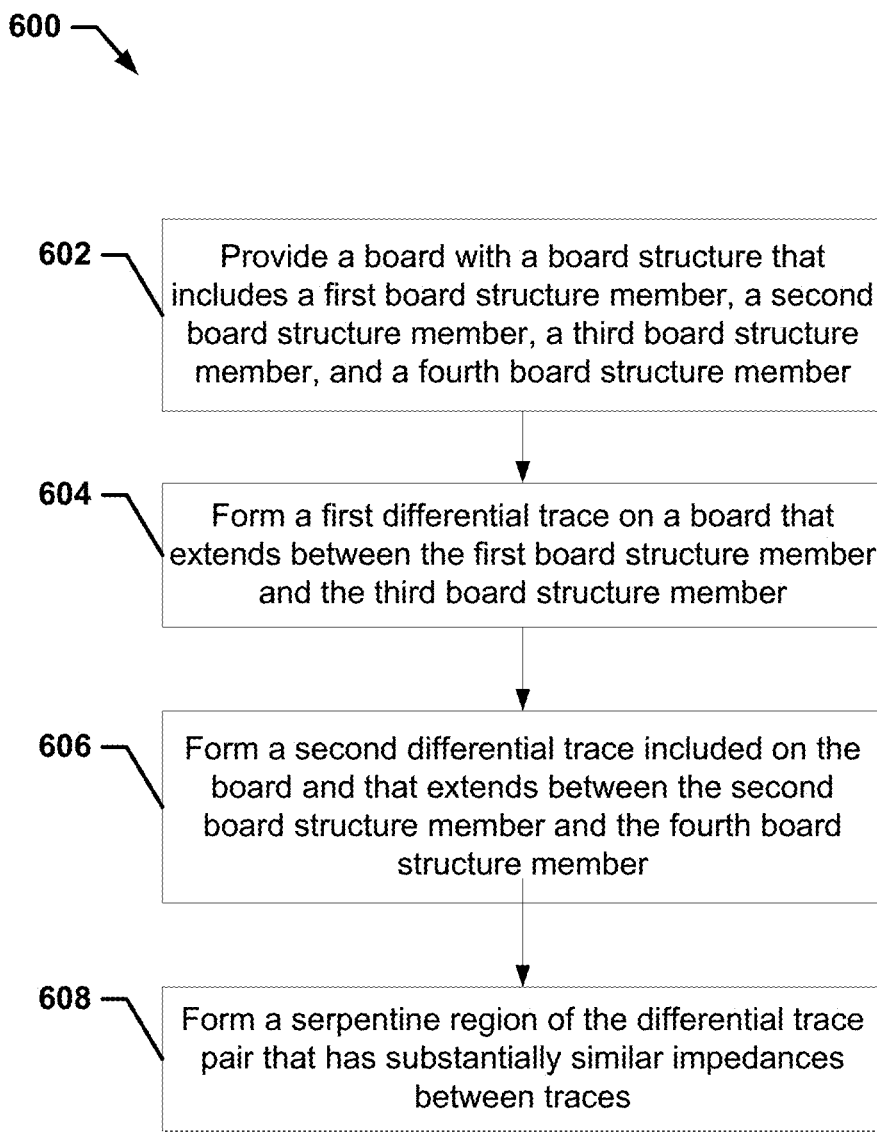
FIG. 6 is a flow chart illustrating an embodiment of a method for providing a differential trace pair.

Referring now to FIGS. 4, 6, 7A, 7B, 7C and 7D, an embodiment of a method 600 of FIG. 6 for providing a differential trace pair is illustrated. FIGS. 7A-7D illustrate different embodiments of a serpentine portion of a differential trace pair 408 including serpentine regions 700a, 700b, 700c, and 700d, respectively, that are provided according to the method 600 but with different dimensions, characteristics, and/or features. As will be appreciated by one of skill in the art in possession of the present disclosure, any of the differing features of the embodiments of the differential trace pairs 408 of FIGS. 7A-7D may be provided according to the blocks of the method 600 discussed below. Furthermore, an experimental embodiment of the differential trace pair 408 having the serpentine region 700b illustrated in FIG. 7B will be discussed in detail and contras to the experimental embodiment of the conventional differential trace pair 502 of FIG. 5 discussed above in order to illustrate the benefits of the systems and methods of the present disclosure over conventional differential trace pair systems and methods. As detailed below, the systems and methods of the present disclosure provide differential trace pairs with serpentine regions with features that minimize impedance discontinuities that are otherwise present in conventional differential trace pair serpentine regions used to compensate for trace length mismatch between board elements. Such benefits may be realized by providing an increased trace width of at least one of the traces in the differential trace pair at location(s) on that trace that exhibits increased spacing from the other trace in order to form the serpentine region, which allows the differential trace pair to be routed to connect to transmitters and/or receivers using serpentine trace length mismatch compensation without that associated impedance mismatch that is present using conventional techniques and that increases reflections and/or losses at higher signal transmission rates.

The method 600 begins at block 602 where a board having a board structure is provided. In the discussions below, the board 402 includes a board structure 404, which may be provided by the board structure 300 discussed above with reference to FIGS. 3a and 3b. As discussed above, the board structure 404 may include a plurality of board structure members 406 including the first board structure member 406a, the second board structure member 406b, the third board structure member 406c, and the fourth board structure member 406d. As would be understood by one of skill in the art in possession of the present disclosure, the board 402 may be provided in a variety of board manufacturing and/or trace routing systems known in the art.

The method 600 then proceeds to block 604 where at least a portion of a first differential trace of a differential trace pair is defined on the board and extends between the first board structure member and the third board structure member. In an embodiment at block 604, the first differential trace 410 of the differential trace pair 408 is providing on the board 402. For example, the first differential trace 410 may be defined, created, formed, etched, and/or otherwise provided by etching and masking techniques such as photoengraving, PCB milling, silk-screen printing, and/or other trace formation techniques known in the art. As discussed above, the first differential trace 410 may electrically couple the first board structure member 406a to the third board structure member 406c, and includes at least a portion that is defined between the first outer edge 410a and the first inner edge 410b that define the first trace width 411 of the first differential trace.

The method 600 then proceeds to block 606 where at least a portion of a second differential trace is defined on the board and extends between the second board structure member and the third board structure member. In an embodiment at block 606, the second differential trace 412 of the differential trace pair 408 is provided on the board 402. For example, the second differential trace 412 may be defined, created, formed, etched, and/or otherwise provided by etching and masking techniques such as photoengraving, PCB milling, silk-screen printing, and/or other trace formation techniques known in the art. As discussed above, the second differential trace 412 may electrically couple the second board structure member 406b to the fourth board structure member 406d, and includes a portion that is defined between the second outer edge 412a and the second inner edge 412b that define the second trace width 413.

The method 600 then proceeds to block 608 where serpentine region(s) of the differential trace pair is formed. As would be understood by one of skill in the art in possession of the present disclosure, in some embodiments the performance of blocks 608 may occur substantially simultaneously with either or both of the defining of the first differential trace at block 604 and the defining of the second differential trace at block 606, and how that combination occurs will depend on the desired features of the serpentine region. Thus, the serpentine region 416 may be defined, created, formed, etched, and/or otherwise provided by techniques such as photoengraving, PCB milling, silk-screen printing, and/or other trace formation techniques known in the art. Referring to FIGS. 7A-7D, the serpentine region 416 of FIG. 4 may include any of the serpentine regions 700a-700d. While a single portion of the serpentine region is illustrated and described in detail with respect to FIGS. 7A-7D, one of skill in the art will appreciate that each of the serpentine regions that operate to increase the length of one of the traces relative to the other in the differential trace pair may be configured in a similar manner while remaining within the scope of the present disclosure. As can be seen, the serpentine regions 700a-700d of the differential trace pair 408 may include a first portion 702 and a second portion 704 in which the first trace width 411 of the first differential trace 410 and the second trace width 413 of the second differential trace 412 are the substantially same. The first differential trace 410 and the second differential trace 412 may also be substantially parallel with each other at the first portion 702 and the second portion 704 and spaced apart by the first differential trace pair spacing 414a.

The serpentine regions 700a-700d may also include a third portion 706 in which at least one of the differential traces 410 and/or 412 includes a third trace width 708 that is greater than the second trace width 413. The first differential trace 410 and the second differential trace 412 may also be substantially parallel with each other at the third portion 706 and spaced apart by the second differential trace pair spacing 414b. As illustrated in FIGS. 7A-7C, the third trace width 708 of the second differential trace 412 is greater than the second trace width 413 of the second differential trace 412. For example, the third trace width 708 may be 1-3 mils greater than the second trace width 413. However, one of skill in the art in possession of the present disclosure will recognize that other increases in trace width would fall under the scope of the present disclosure. For example, as illustrated in FIG. 7D, the third trace width 708 of the first differential trace 410 may be greater than the first trace width 411 of the first differential trace 410. In another example illustrated in FIG. 7C, the first differential trace 410 may include a fourth trace width 710 at the third portion 706 that is greater than the first trace width 411 of the first differential trace 410 at the first and second portions 702 and 704. In embodiments where the first differential trace 410 includes the increased fourth trace width 710, the third trace width 708 of the second differential trace 412 may be less than the third trace width 708 provided in the third portion 706 of the serpentine regions 700a and 700b that include the first differential trace 410 having the first trace width 411. In such an embodiment, the length of the portion of the first differential trace 410 having the fourth trace width 710 may be substantially the same as the length of the portion of the second differential trace 412 having the third trace width 708.

In various embodiments, the serpentine regions 700a-700d may include a first transition portion 712 that extends between the second differential trace 412 included in the first portion 702 and the second differential trace 412 included in the third portion 706. Similarly, the serpentine regions 700a-700d may include a second transition portion 714 that extends between the second differential trace 412 included in the third portion 706 and the second differential trace 412 included in the second portion 704. The transition portions 712 and 714 are provided to compensate for the mismatch in the length of the "short" second differential trace 412 with the "long" first differential trace 410, as discussed above. As illustrated in FIGS. 7B, 7C, and 7D, the first transition portion 712 and the second transition portion 714 may maintain the second trace width 413 between the second outer edge 412a and the second inner edge 412b of the second differential trace 412. Thus, the first transition portion 712 and the second transition portion 714 in FIGS. 7B-7D have the second trace width 413, resulting in a first step transition between the first transition portion 712 and the second differential trace 412 in the third portion 706, and a second step transition between the second transition portion 714 and the second differential trace 412 in the third portion 706. However, as illustrated in FIG. 7A, the width of the first transition portion 712 may gradually increase from the second trace width 413 to the third trace width 708, and the width of the second transition portion 714 may gradually decrease from the third trace width 708 to the second trace width 413. As a result of providing the wider differential traces 410 and/or 412 in the third portion 706, the first portion 702 and the second portion 704 of the differential trace pair 408 each provide a first impedance that is substantially similar (e.g., within 4%) to a second impedance provided by the differential trace pair 408 at the third portion of the serpentine regions 700a-700d As discussed above, in an experimental embodiment of FIG. 7B, the differential trace pair 408 was provided with 2 inches of trace. The serpentine region 700b included a first differential trace spacing of 6 mils, a second differential trace spacing of 20 mils, first trace width 411 and second trace width 413 of 5 mils, and a third trace width 708 of 10 mils. With such dimensions, the first and second portions 702 and 704 of the serpentine region 700b provided a first impedance of 85 ohms while the third portion 706 of the serpentine region 700b provided a second impedance of 87 ohms when transmitting at 56 Gbps. Thus, the first impedance and the second impedance may be matched and/or provided such that they are substantially similar throughout the serpentine region 416, which eliminates or reduces the impedance discontinuity between the third portion of the serpentine region 416 and each of the first portion 702/second portion 704 of the serpentine region 416 relative to conventional systems and methods. As such, the portions 702, 704, and 706 of the serpentine region 700b may be provided with widths such that that are not subject to the issues associated with conventional serpentine traces discussed above such as reflections, return losses, insertion loss, and/or a variety of other issues that result in degradation of the Bit Error Rate (BER) and Eye Diagram, and reduce the margin for detecting errors in data transmission and reception as discussed with reference to FIGS. 8, 9, 10A, and 10B discussed below.

Figure 8:
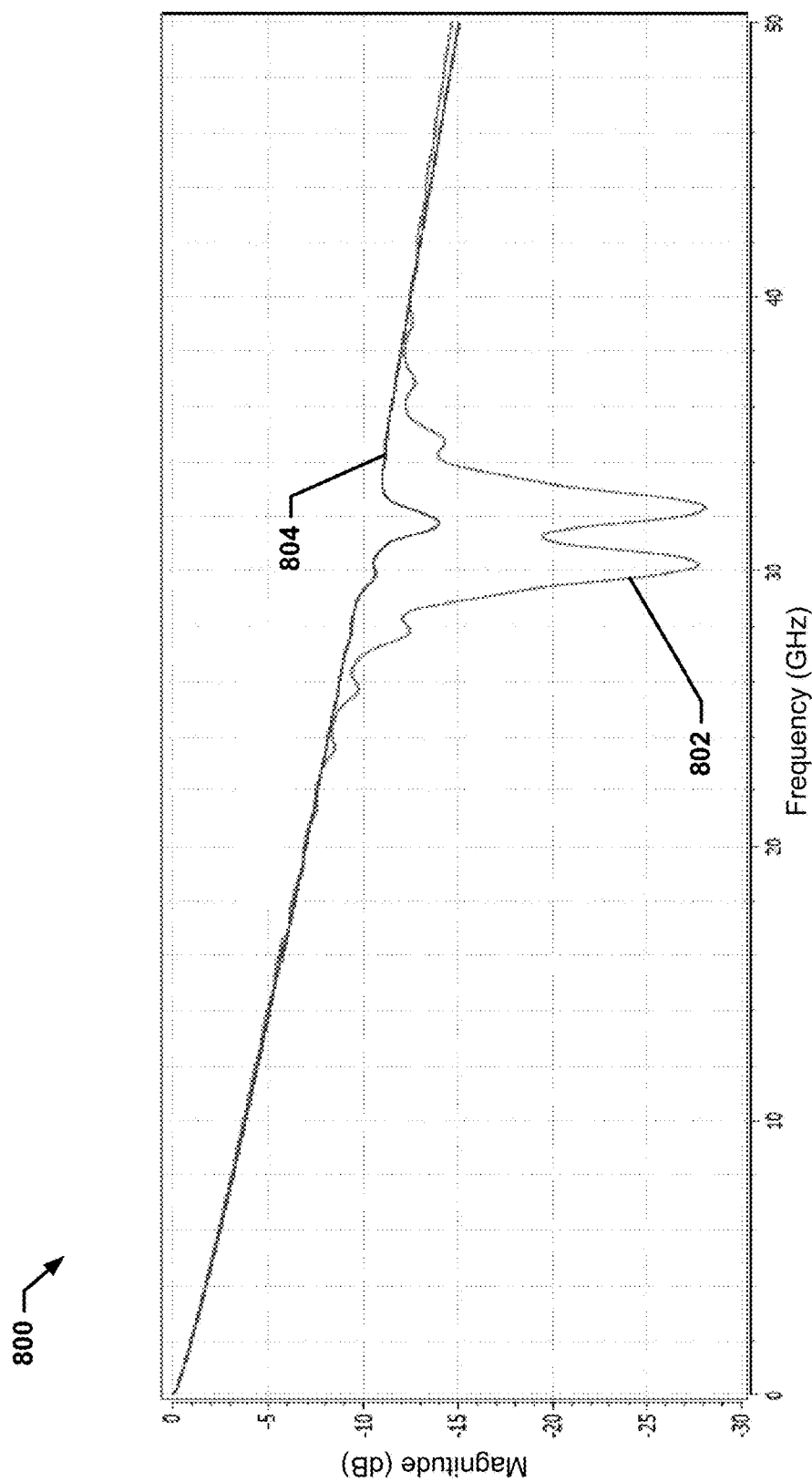
FIG. 8 is a graph illustrating an embodiment of insertion losses that may be introduced due to serpentine regions provided using the systems and methods of the present disclosure and as compared to conventional serpentine regions.

Referring now to FIG. 8, a graph 800 is provided that illustrates some of the benefits of the systems and methods of the present disclosure. The graph 800 plots insertion losses between a transmitter and a receiver using a differential trace pair with serpentine regions that provide for connection to the transmitter and the receiver via the conventional serpentine region 416/502 discussed above with reference to FIGS. 4 and 5, and the experimental serpentine region 700b discussed above with reference to FIG. 7B. The insertion loss of the differential trace pair that includes the conventional serpentine region embodiment 416/502 (as illustrated in FIG. 4) is plotted on the graph 800 of loss vs. frequency as plot 802, while insertion loss of the differential trace pair that includes the serpentine region 700b of the present disclosure (as illustrated in FIG. 7B) is plotted on the graph 800 as plot 804. As can be seen, the insertion losses over the frequency range illustrated in FIG. 8 were substantially reduced for the serpentine region 700b according to the present disclosure relative to the conventional serpentine region embodiment 416/502.

Figure 9:
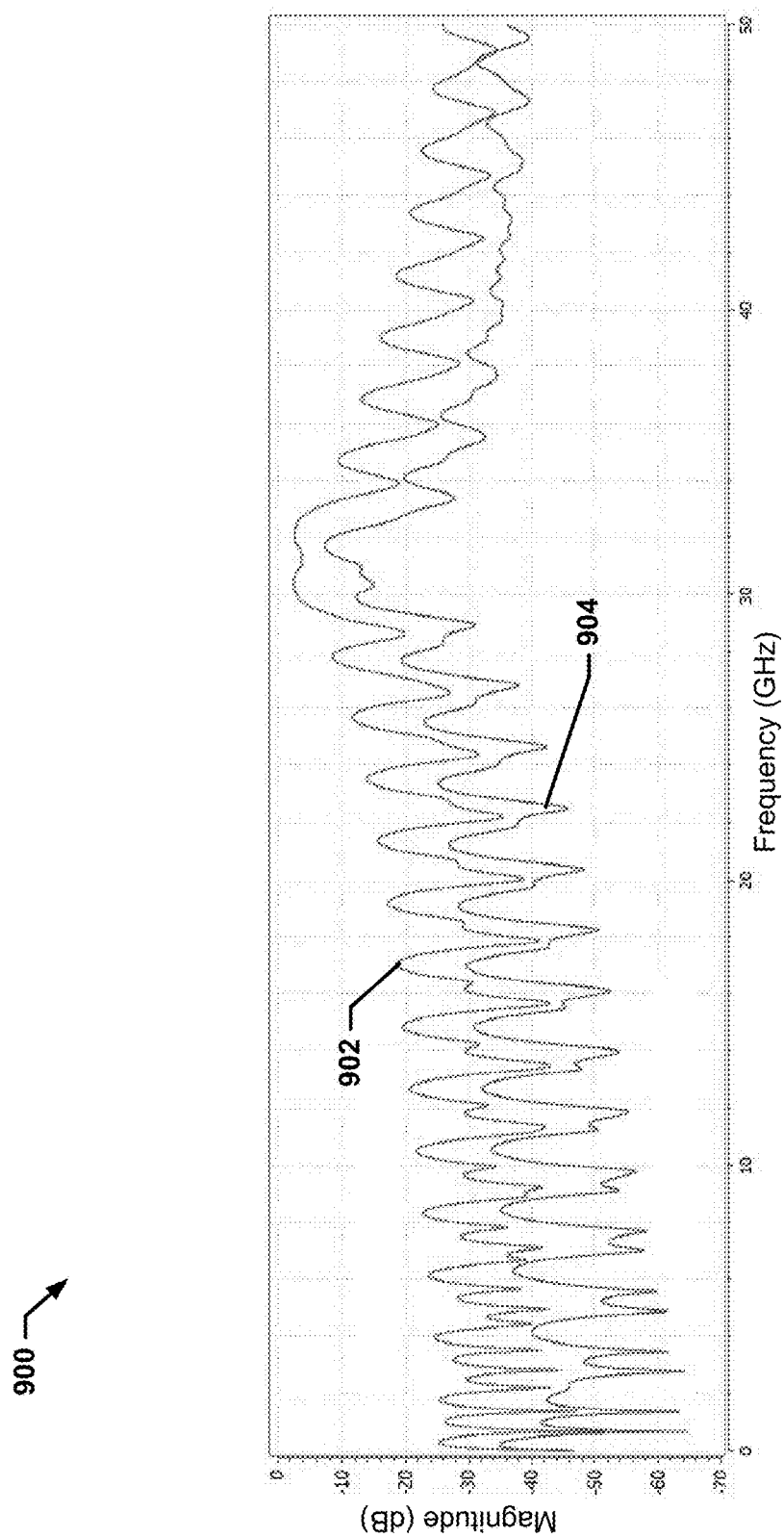
FIG. 9 is a graph illustrating an embodiment of return losses that may be introduced due to serpentine regions provided using the systems and methods of the present disclosure and as compared to conventional serpentine regions.

Referring now to FIG. 9, a graph 900 is provided that plots return losses between a transmitter and a receiver using a differential trace pair with serpentine regions that provide for connection to the transmitter and the receiver via the conventional serpentine region 416/502 discussed above with reference to FIGS. 4 and 5, and the experimental serpentine region 700b discussed above with reference to FIG. 7B. The return loss of the differential trace pair that includes the experimental conventional serpentine region embodiment 416/502 (as illustrated in FIG. 4) is plotted on the graph 900 of loss vs. frequency as plot 902, while the return loss of the differential trace pair that includes the serpentine region 700b of the present disclosure (as illustrated in FIG. 7B) is plotted on the graph 900 as plot 904. As can be seen, the return losses over the frequency range illustrated in FIG. 9 were substantially reduced for the serpentine region 700b according to the present disclosure relative to the conventional serpentine region embodiment 416/502.

Figure 10A:
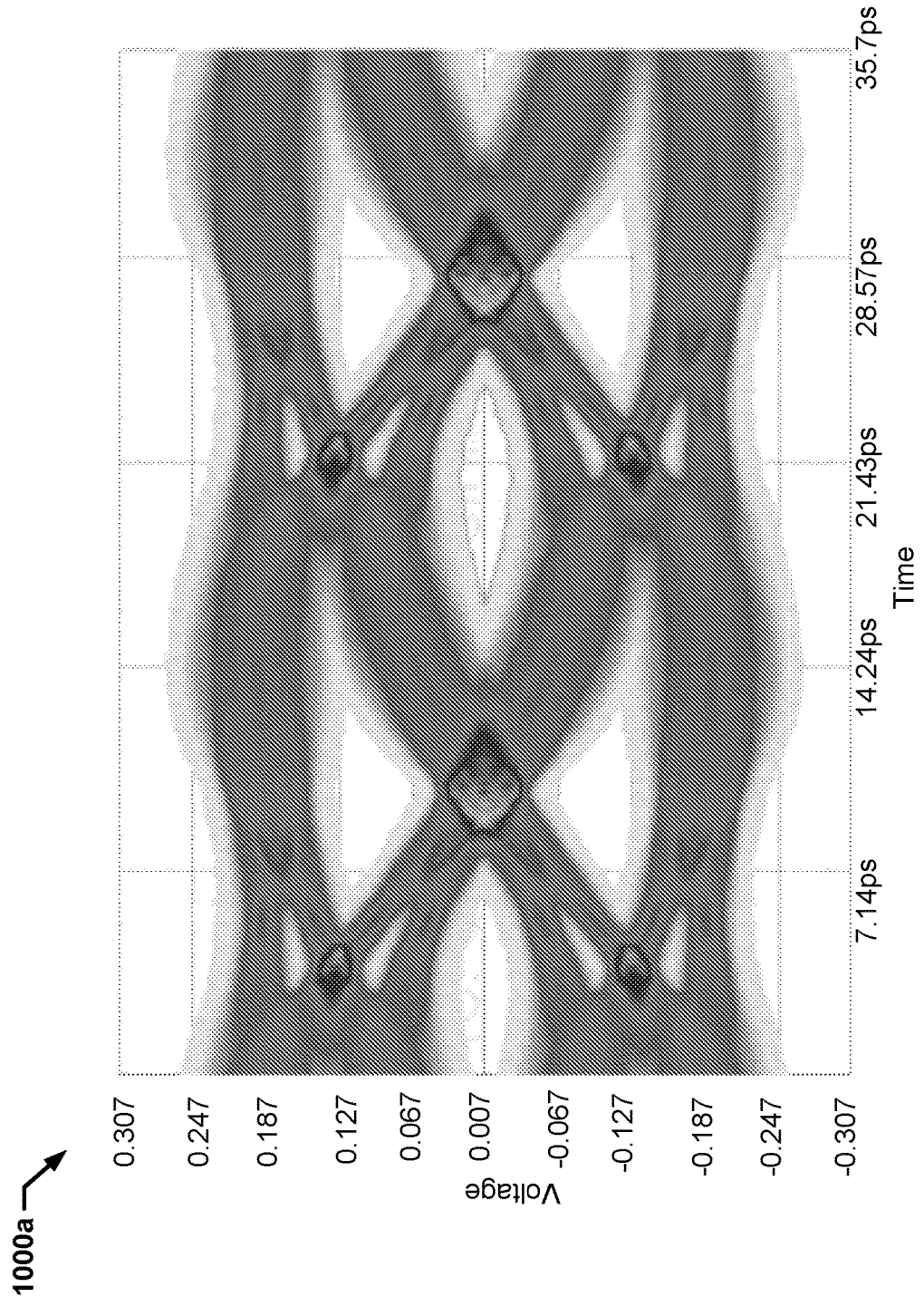
FIG. 10A is a graph illustrating an embodiment of eye diagram of a time domain simulation for a conventional serpentine region in a differential trace pair.
Figure 10B:
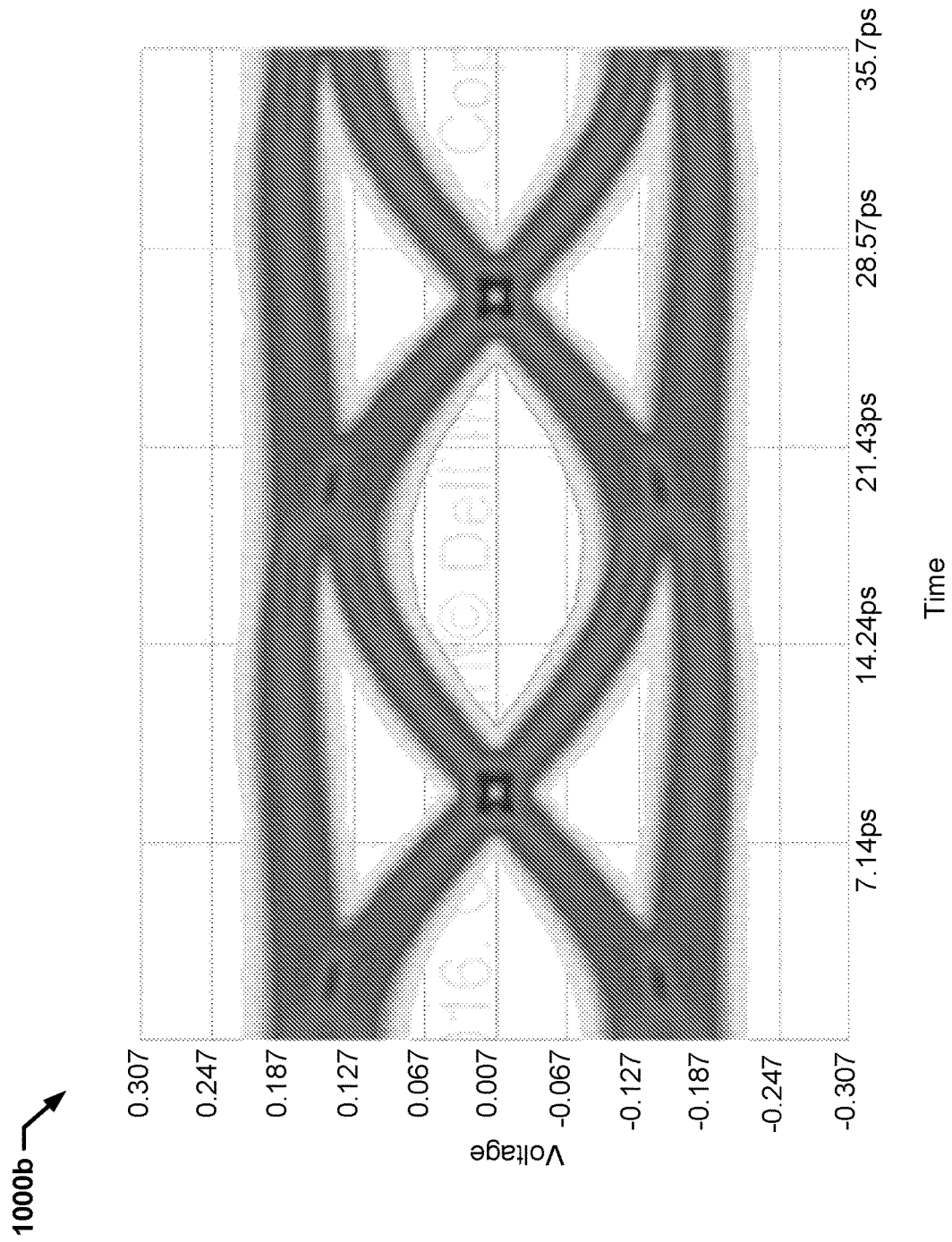
FIG. 10B is a graph illustrating an embodiment of eye diagram of a time domain simulation for a serpentine region in a differential trace pair provided using the systems and methods of the present disclosure.

Referring now to FIGS. 10A and 10B, an eye diagram 1000a is illustrated in FIG. 10A that illustrates a time domain simulation of the conventional serpentine region 416 (as illustrated and discussed in FIGS. 4 and 5). During the time domain simulation the transmitter was transmitting at 56 Gbps over the differential trace that included the conventional serpentine region 416. The time domain simulation resulted in an eye width of 7.7 ps and an eye height of 39.00 mV. Similarly, an eye diagram 1000b is illustrated in FIG. 10B that illustrates a time domain simulation of the experimental serpentine region 700b (as illustrated and discussed in FIG. 7B). During the time domain simulation the transmitter was transmitting at 56 Gbps over the differential trace that included the experimental serpentine region 700b. The time domain simulation resulted in an eye width of 13.0 ps and an eye height of 147.6 mV. Thus, the experimental serpentine region 700b provided over a 300% improvement in the eye of the eye diagram when compared to eye diagram generated using the conventional serpentine region 416.

Thus, systems and methods for providing differential trace pairs have been described that provide serpentine regions that minimize impedance discontinuities that are otherwise present in conventional differential trace pair serpentine regions that are provided to compensate for trace length mismatch between connectors. Such benefits are realized by providing an increased trace width of at least one of the traces of the differential trace pair in serpentine region(s) of the differential trace pair where the traces are spaced further apart from each other. As such, differential trace pairs may be routed to connect to transmitters and/or receivers using serpentine trace length mismatch compensation without an impedance mismatch that increases reflections and/or losses at higher transmission rates.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method for providing a differential trace pair, comprising:
   forming a first differential trace on a board, wherein the first differential trace includes a first differential trace region along which the first differential trace has a first width; and
   forming a second differential trace on the board that is part of a differential trace pair with the first differential trace, wherein the second differential trace includes a serpentine region that extends adjacent the first differential trace region, and wherein the serpentine region includes:
      a first portion and a second portion that:
         each have the first width;
         are each substantially parallel to the first differential trace; and
         that are each spaced apart from the first differential trace by a first differential trace pair spacing; and
      a third portion that is located between the first portion and the second portion and that:
         has a second width that is greater than the first width of a first differential trace section of the first differential trace region that:
            is paired with the third portion of the serpentine region; and
            has substantially the same length as the third portion of the serpentine region; and is spaced apart from the first differential trace section of the first differential trace region by a second differential trace pair spacing that is greater than the first differential trace pair spacing.

2. The method of claim 1, wherein the serpentine region includes:
   a first transition portion that extends between the first portion and the in the third portion; and
   a second transition portion that extends between the third portion and the second portion.

3. The method of claim 2, wherein the first transition portion and the second transition portion have the first width, and wherein the second width provides:
   a first step transition between the first transition portion and the third portion; and
   a second step transition between the second transition portion and the third portion.

4. The method of claim 1, wherein the first portion of the serpentine region provides a first impedance that is substantially the same as a second impedance provided by the second portion of the serpentine region.

\* \* \* \* \*